United States Patent [19]

Cutchaw

[11] Patent Number: 4,730,665

[45] Date of Patent: Mar. 15, 1988

[54] APPARATUS FOR COOLING HIGH-DENSITY INTEGRATED CIRCUIT PACKAGES

[75] Inventor: John M. Cutchaw, Scottsdale, Ariz.

[73] Assignee: Technology Enterprises Company, Scottsdale, Ariz.

[21] Appl. No.: 909,182

[22] Filed: Sep. 19, 1986

Related U.S. Application Data

[63] Continuation-in-part of Ser. No. 721,074, Apr. 8, 1985, Pat. No. 4,612,978, which is a continuation-in-part of Ser. No. 513,618, Jul. 14, 1983, Pat. No. 4,531,146.

[51] Int. Cl.[4] .............................................. H01L 23/46
[52] U.S. Cl. .................................... 165/80.4; 165/185; 165/903; 361/385; 357/82
[58] Field of Search ...................... 165/185, 80.4, 903, 165/104.33; 361/385; 357/82

[56] References Cited

U.S. PATENT DOCUMENTS

| | | | |
|---|---|---|---|
| 3,171,731 | 3/1965 | Barger et al. | 165/185 |
| 3,274,429 | 9/1966 | Swiadek | 165/905 |
| 3,995,181 | 11/1976 | Suit | 165/104.33 |

OTHER PUBLICATIONS

McGregor, J. E., *Component Support and Cooling*, IBM Technical Disclosure Bulletin, vol. 2, No. 5, 2/1960.

*Primary Examiner*—Albert W. Davis, Jr.
*Attorney, Agent, or Firm*—Herbert E. Haynes, Jr.

[57] ABSTRACT

An apparatus for containing and cooling high-density integrated circuit packages includes a housing in which the circuit package is sealingly mounted in an internal chamber of said housing. The chamber is at least partially filled with a plurality of thermally conductive spheroids which are biased into thermally conductive contact with each other and with the integrated circuit package to maximize the heat exchange surface. The apparatus includes an inlet and an outlet for passing a dielectric immersion coolant through the chamber in direct heat exchange relationship with the spheroids and with the high-density integrated circuit package.

19 Claims, 7 Drawing Figures

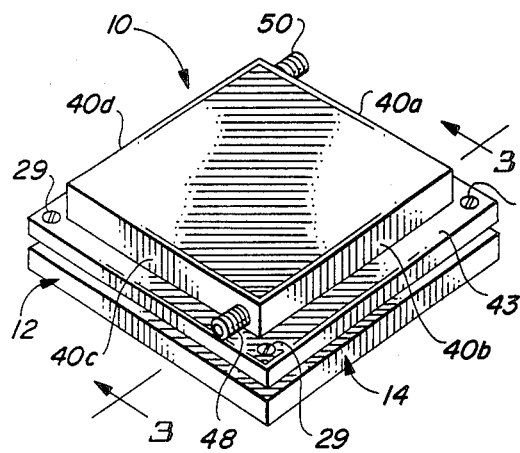
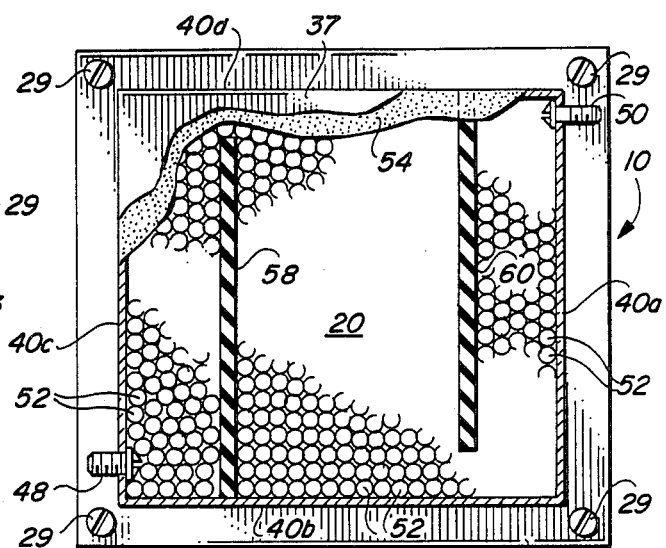
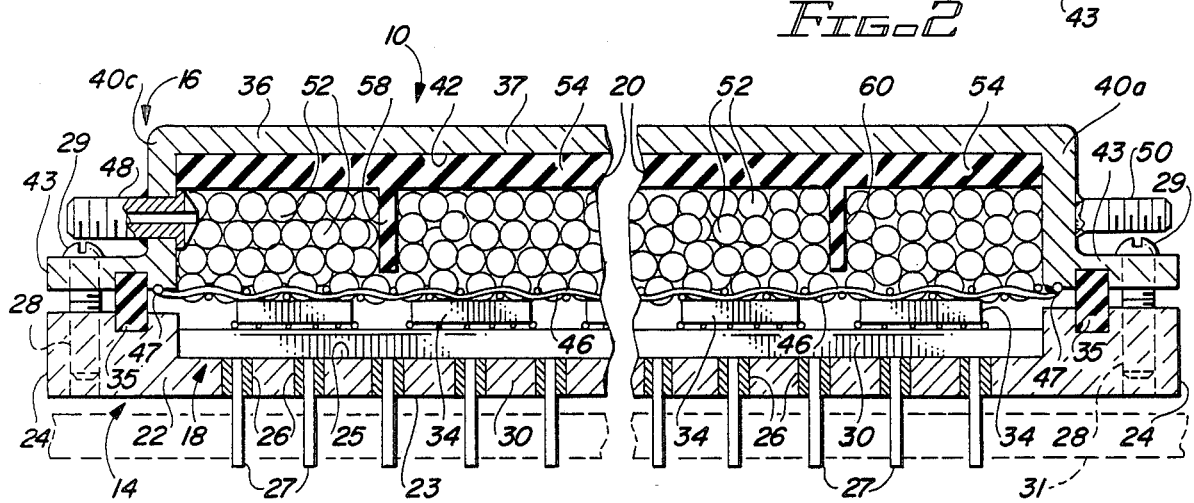
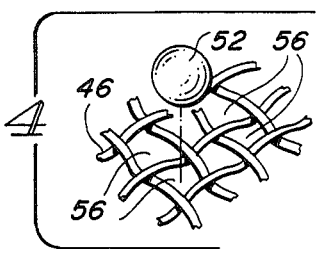
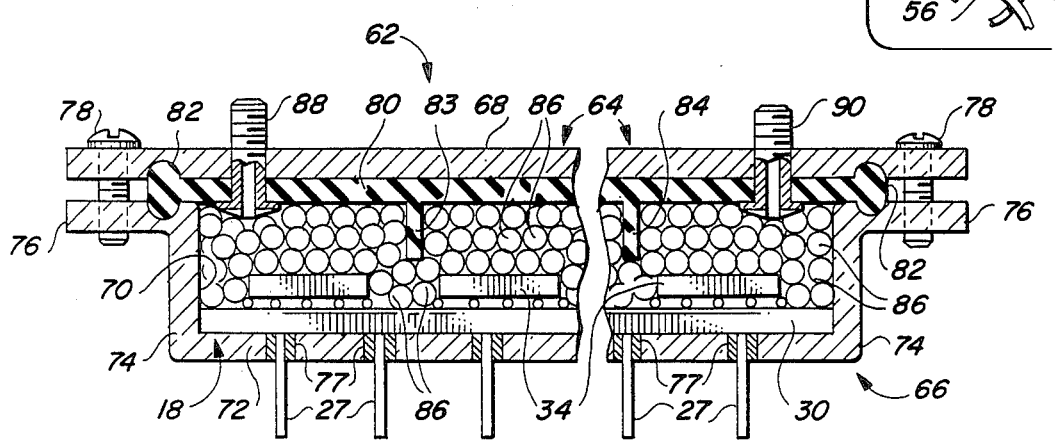

APPARATUS FOR COOLING HIGH-DENSITY INTEGRATED CIRCUIT PACKAGES

CROSS REFERENCE TO RELATED APPLICATION

This application is a continuation-in-part of my co-pending U.S. patent application Ser. No. 721,074, filed on Apr. 8, 1985, for APPARATUS FOR COOLING HIGH-DENSITY INTEGRATED CIRCUIT PACKAGES which issued as U.S. Pat. No. 4,612,978, on Sept. 23, 1986, with that patent being in turn a continuation-in-part of my co-pending U.S. patent application Ser. No. 513,618, filed July 14, 1983, for APPARATUS FOR COOLING HIGH-DENSITY INTEGRATED CIRCUIT PACKAGES, which issued as U.S. Pat. No. 4,531,146 on July 23, 1985.

BACKGROUND OF THE INVENTION

1. Field of the Inventions

This invention relates to cooling mechanisms and more particularly to an apparatus for cooling high-density integrated circuit packages.

2. DESCRIPTION OF THE PRIOR ART

In the electronics industry in general, and the computer arts in particular, one design objective for some time now has been aimed at increasing operational speeds and decreasing unit sizes. One of the major factors which contributed significantly to this objective is, of course, the integrated circuit chip, or dice as it is sometimes referred to in the industry. Initially, a single dice was mounted in a suitable package, such as a dual-in-line package, and such packages are in common use. However, the trend today is for mounting a plurality of dice in a single package to increase operating speeds by reducing the distances that signals must travel, and also reduce spaces occupied by the individual dice packaging technique.

Significant gains were made when plural dice were mounted on a two-sided substrate and encapsulated in what is known as a JEDEC package. In those packages, electrical connections between the plural dice are made within the encapsulating package, and electrical contacts are provided about the package periphery for connection with with other components of the overall system. The limiting factor of these JEDEC packaging arrangements is the space available on the opposite sides of the substrate for connecting the dice together.

Another relatively recent development in this field is the use of a multi-layer substrate which significantly increases the space available for internal connections. In particular, one package developed by IBM Corporation has successfully mounted 133 dice on a multi-layer ceramic substrate having 33 layers. This package is 90 mm square and has an array of 361 pins depending from the bottom surface of the multi-layer substrate. The pins are soldered into a circuit board which electrically connects the individual pins to the proper components of the overall system.

While this relatively new dice packaging has achieved the desired increased operating speeds, and reduced the overall size, the ultra-high packaging density has created problems relating to heat dissipation. Cooling by radiation into the atmosphere is completely out of the question, and the use of blowers for moving relatively high velocities of air across the packages is inadequate, and liquid cooling systems are being used.

Many of the earlier developed liquid cooling systems, some were developed for use with the JEDEC packages, are inadequate for use with the newly developed multi-layer packaging technology due to insufficient heat transfer between the plural dice and the liquid coolant, and their inability to carry away a sufficient amount of heat generated by the large number of dice.

The cooling system developed by IBM Corporation for use with the hereinbefore described multi-layer packages, includes intricate metal castings, one of which contains the package in a helium filled environment which is provided with 133 bores, each containing a spring-loaded piston. Each of these pistons is in contact with a different one of the dice to carry heat away from the dice through the piston, spring, and metal of the casting. Another metal casting is carried atop the piston casting to provide a chilled coolant chamber, which absorbs heat from the lower casting. This cooling apparatus is an exceptionally complex and costly mechanism, occupies a considerable amount of space, and its thermal transfer efficiency is questionable due to the plural heat conductors and interfacing gaps which are encountered by heat migrating from the dice through the pistons, through the springs, through the metal top wall of the lower casting, through the metal lower wall of the top casting and ultimately to the circulating coolant.

Another prior art structure which is disclosed in my U.S. Pat. No. 4,381,032, includes a base in which the high-density circuit package is nestingly mounted. A heat exchanger is mounted on the base so as to sealingly enclose the circuit package. The heat exchanger includes a rigid housing having a downwardly opening coolant chamber which is enclosed by a thin wall metallic diaphragm that rests in thermally conductive contiguous contact with each of the dice of the integrated circuit package. A liquid coolant is circulatingly moved through the coolant chamber which biases the diaphragm into conductive contact with the dice in addition to its carrying away the heat generated by operation of the integrated circuit package. To insure a more positive contact between the diaphragm and the dice, additional biasing forces are applied to the diaphragm by elastomeric elements, or spring-loaded pistons, provided in the cooling chamber, and these elastomeric elements, or spring-loaded pistons, apply their biasing force to localized areas of the diaphragm with those areas being those which are in contact with the dice of the circuit package. Although this prior art structure is quite efficient, its ability to carry away the operational heat of the operating integrated circuit package is limited by the heat transfer capabilities of the thin-wall diaphragm and the ability of the circulating coolant to absorb the heat transferred thereto by the diaphragm.

In my above referenced related U.S. patents, I filled the coolant chamber with thermally conductive spheres so that they are in heat conductive contact with each other and with the membrane which separates the coolant chamber from the circuit packages. The thermal conductivity of the spheroids is superior to that of the coolant. Therefore, the heat conducted through the membrane wall is readily conducted to the spheroids at each point where they are in contact with the membrane, and the heat is similarly transferred to each of the spheroids in that each spheroid is in contact with the several spheroids adjacent thereto. This results in a substantial increase in the heat exchange surface thereby improving the transfer of heat from the circuit packages to the coolant.

Although filling the coolant chamber with thermally conductive spheroids provides an improvement over prior art cooling systems, there is still some loss in cooling efficiency due to the cooling chamber being separated from the source of heat by the thermally conductive membrane wall.

The existence of florochemical liquid coolants has been known for many years. Such coolants have excellent electrical insulating properties, chemical inertness and low boiling points and are used extensively in cooling large power supplies and other large high voltage devices, with the devices to be cooled being immersed in the coolant. While such coolants are very efficient they have not been widely used due to the heavy weight and cost of the coolant. Also, these florochemical liquids present problems with regard to expansion and contraction and the greater the quantity used in the system to be cooled, the greater are the expansion and contraction problems.

Other special liquid coolants having excellent dielectric properties such as freon, silicone oil, transformer oil, liquid nitrogen and the like are also known. For various reasons, such as those discussed above relating to florochemical liquid coolants, these special liquid coolants have received little or no consideration concerning their use in cooling high density integrated circuit packages.

Therefore, a need exists for a new and improved apparatus for cooling high-density integrated circuit packages which overcomes some of the problems and shortcomings of the prior art.

SUMMARY OF THE INVENTION

In accordance with the present invention, new and improved apparatuses for cooling high-density integrated circuit packages are disclosed as including a housing means for containing the high-density circuit packages with the housing means being at least partially filled with thermally conductive spheroids and adapted for circulating flow of a dielectric immersion coolant such as florochemical liquid coolant through the housing for direct cooling of the circuit packages.

In a first embodiment, the housing means includes a base in which the circuit packages to be cooled are nestingly mounted. A cover is sealingly mounted atop the base and is configured to define a downwardly opening chamber which is filled with the thermally conductive spheres. The downwardly opening chamber of the cover is closed with a screen for containing the spheres therein with the screen having a mesh which provides the openings thereof with the size that is slightly smaller than the spheroids. In this way, the spheroids protrude part way through the screen so as to be in direct contact with the circuit packages to be cooled. The cover is provided with an inlet and outlet for circulation of the dielectric immersion coolant through the housing means.

In a second embodiment, the housing means includes a base defining the circuit package receiving chamber with that chamber being filled with the spheroids so as to surround the circuit packages. The base is sealingly closed with a planar cover and the dielectric immersion coolant is circulated through the chamber defined by the base.

In both embodiments, the spheroids are biased by a resilient elastomeric pressure pad means into bearing engagement with each other and with the circuit packages to be cooled. Since there is a multiplicity of the spheroids, physical contact of the spheroids with the circuit packages will be made at multiple points on the circuit packages. Thus, the heat produced by the circuit packages will be carried away by conduction through the spheroids and the heat will be similarly conducted to each spheroid contained in the housing means in that each spheroid is in bearing engagement with the several spheroids adjacent thereto. This, in effect, results in a substantial increase in the heat exchange surface area which transfers heat by radiation, convection and conduction to the coolant that is passed through the housing means.

Other advantages, result from the use of the thermally conductive spheroids in the housing means. First, the spheroids present a tortuous flow path through the chamber of the housing means to prevent channelization and provide a turbulence flow for the dielectric immersion coolant. The fluid turbulence produced by the spheroids serves to continuously sweep away the heated laminar fluid flow which tends to form on the heat exchange surfaces. By sweeping away the heated laminar fluid flow, a continuous flow of much cooler liquid comes into direct contact with the heat exchange surfaces. Secondly, the use of the thermally conductive spheroids in the housing means helps to overcome some of the problems associated with the use of dielectric immersion coolants. As hereinbefore mentioned, some of the dielectric immersion coolants, especially florochemical liquid coolants are very heavy and costly. Since the spheroids substantially fill the chamber of the housing means, the quantity of the dielectric immersion coolant needed is substantially reduced, which of course, reduces the weight and costs usually associated with the use of such coolants. Also, the reduction in the quantity of coolant required reduces the problems of expansion and contraction of the dielectric immersion coolant.

Accordingly, it is an object of the present invention to provide a new and improved apparatus for cooling high-density integrated circuit packages.

Another object of the present invention is to provide a new and improved apparatus for cooling high-density integrated circuit packages which is of minimum complexity, cost and size.

Another object of the present invention is to provide a new and improved apparatus for cooling high-density integrated circuit packages and having improved heat transfer efficiency.

Another object of the present invention is to provide a new and improved apparatus for cooling high-density integrated circuit packages which includes an especially configured housing means which sealingly encloses high-density integrated circuit packages within a chamber defined by the housing means which also contains a plurality of thermally conductive spheroids for carrying heat away from the packages by means of a dielectric immersion coolant which is passed through the chamber of the housing means.

Another object of the present invention is to provide an apparatus of the above described character wherein the plurality of thermally conductive spheroids are contained within the chamber of the housing means and are biased into bearing engagement with each other and with the circuit packages to be cooled by a resilient elastomeric pressure pad which is also contained in the chamber of the housing so that the heat conducted away from the integrated circuit package is absorbed by the spheroids to increase the effective heat exchange surface area which is in contact with the coolant for improved heat transfer purposes.

Still another object of the present invention is to provide an apparatus of the above described character wherein the multiple spheroids in the chamber of the are arranged to present a tortuous coolant flow path through the chamber.

The foregoing and other objects of the present invention, as well as the invention itself, may be more fully understood from the following description when read in conjunction with the accompanying drawings.

BRIEF DESCRIPTION OF THE DRAWINGS

FIG. 1 is a perspective view of one embodiment the apparatus for cooling high-density integrated circuit packages of the present invention.

FIG. 2 is a plan view of the apparatus shown in FIG. 1 with portions thereof being broken away to show the various features thereof.

FIG. 3 is an enlarged fragmentary sectional view taken along the line 3—3 of FIG. 1.

FIG. 4 is fragmentary exploded view showing the relationship of a typical one of the spheroids with the retainer screen of the first embodiment of the apparatus of the present invention.

FIG. 5 is a fragmentary sectional view similar to FIG. 3 and showing a second embodiment of the apparatus of the present invention.

DESCRIPTION OF THE PREFERRED EMBODIMENTS

Figure 6:
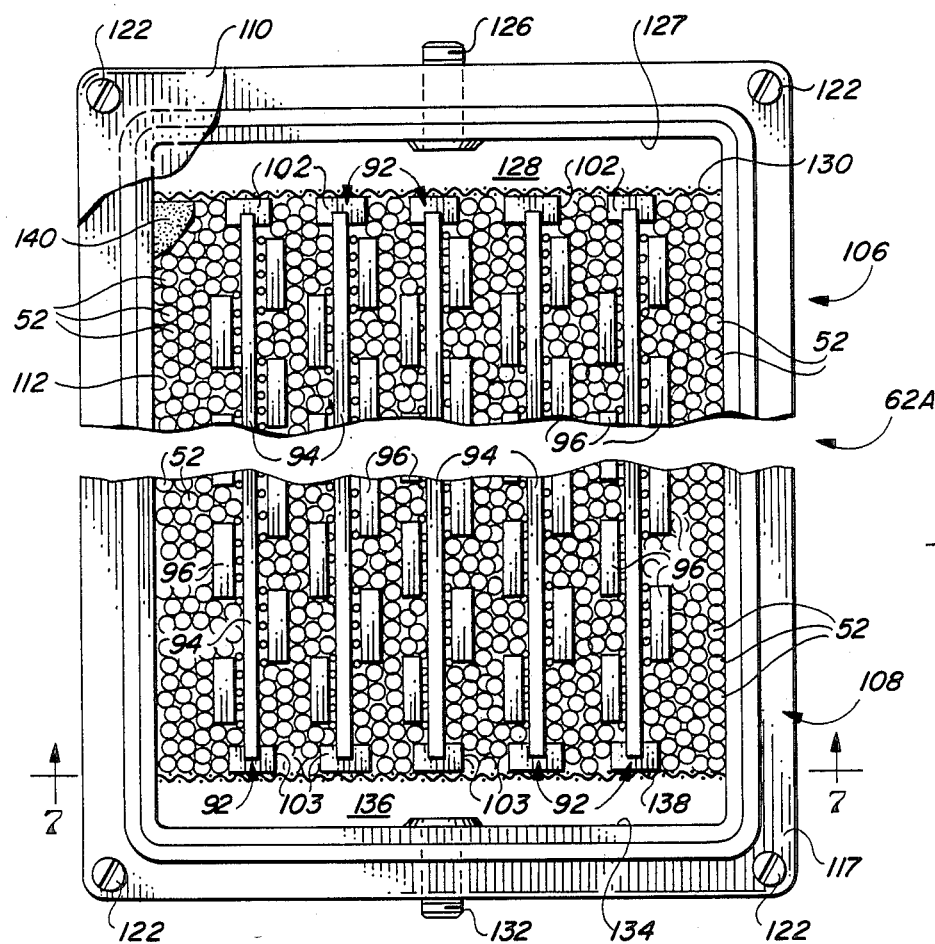
FIG. 6 is a plan view showing still another embodiment of the present invention with this view being partially broken away to show the various features thereof.

Referring more particularly to the drawings, wherein a first embodiment of the apparatus for cooling high-density integrated circuit packages is identified in its entirety by the reference numeral 10. The apparatus 10, which is intended to be used in conjunction with a coolant circulation system (not shown), includes a housing means 12 having a base 14 and cover 16 which cooperatively sealingly enclose a high-density integrated circuit package 18 (FIG. 3) in a chamber 20 through which a coolant is circulated to carry away the heat generated by operation of the circuit package.

The base 14 is best seen in FIG. 3 to be a substantially planar housing 22 having a floor 23 with an endless upstanding sidewall 24 which defines an upwardly opening lower portion 25 of the chamber 20 for nestingly receiving the circuit package 18. The floor 23 is provided with a plurality of apertures 26 which are arranged in a geometric array which matches the array of conductive pins 27 which depend from the circuit package 18, so that each of the pins 27 passes through a different one of the apertures 26 and extend beyond the floor 23 of the base. A suitable seal, such as of glass, is provided in each of the apertures 26 so that the base 14 will be a hermetically sealed structure for reasons which will become apparent as this description progresses.

The base 14 is also provided with internally threaded bores 28 at its corners for containing fastener means 29 by which the cover 16 is demountably mounted on the base 14. As seen best in FIGS. 2 and 3, the fastener means 29 pass through suitable bores formed through each of the corners of the cover 16 to demountably attach the cover 16 on the base 14.

The high-density integrated circuit package 18 forms no part of the apparatus of the present invention, but is shown and will now be briefly described for completeness of this disclosure. The package 18 includes a multilayer substrate 30, usually of ceramic, and the hereinbefore mentioned multiplicity of pins 27 extend from one planar surface of the substrate. The pins 27 provide means for making the necessary electrical interconnections between the integrated circuit package 18 and the other components of the electronic system (not shown) in which the package is to be used. Further, in accordance with customary practices, the pins 27 are also used to mount the package on a circuit board 31, which is indicated in phantom lines in FIG. 3, such as by soldering the pins in holes provided on the circuit board. The opposite planar surface of the multi-layer substrate 30 has a plurality of discrete integrated circuits 34, or dice, mounted thereon in a predetermined geometric array which usually consists of a plurality of equally spaced rows and columns.

As seen in FIG. 3, the upwardly opening lower portion 25 of the chamber 20 of the base 14 is deeper than the thickness dimension of the substrate 30 and a suitable elastomeric seal 35, has its lower portion contained in an endless groove formed in the upwardly facing surface of the sidewall 24. The seal 35 extends above the upwardly facing surface of the endless sidewall 24 of the base 14 and has its upper end contained in a similar groove formed in the cover 16, for sealingly encasing the integrated circuit package 18 in the apparatus 10.

The cover 16 includes a housing 36 which includes a roof wall 37 with an integrally depending endless sidewall formed of sidewall segments 40a, 40b, 40c and 40d, which cooperatively define the downwardly opening upper portion 42 of the coolant chamber 20. An endless flange 43 extends normally from the sidewall of the housing 36.

The downwardly opening upper portion 42 of chamber 20 is closed by an open mesh screen 46. The screen 46 includes a peripheral bead 47 with the peripheral bead being frictionally or otherwise contained in an endless groove provided in the downwardly facing surface of the endless flange 43 of the housing 36 for fixed attachment of the screen thereto.

The cover 16 of the housing means 12 is provided with a coolant inlet fitting 48 in the sidewall segment 40c of the cover housing 36, and a coolant outlet fitting 50 is provided in the opposite sidewall segment 40a. The fittings 48 and 50 are of special configuration as will hereinafter be described in detail.

A plurality of thermally conductive spheroids 52 and a resilient elastomeric pressure pad 54 are both contained within the upper portion 42 of the chamber 20 by means of the screen 46. The spheroids are formed of a material having good thermal conduction properties, such as metal, ceramic or the like, for reasons which will hereinafter be described, and are seen to substantially fill the upper portion 42 of the chamber 20. The pressure pad 54 is compressingly interposed between the inwardly facing surface of the roof wall 37 and the upper layer of the spheroids 52. In this manner, the pressure pad 54 will biasingly urge the spheroids 52 toward the open mesh screen 46 and into thermally conductive contact with each other.

As seen best in FIG. 4, the open mesh screen 46 is selected so that each opening 56 of the screen is somewhat smaller than the diameter of one of the plurality of spheroids 52. In this manner, the spheroids will protrude part way through the openings of the screen 46 and thus extend into the lower portion 25 of the chamber 20. The open mesh screen 46 lies in a plane which is coincident with, or proximate, the plane defined by the flange 43 of the cover 16. As shown, the upper end surfaces of the discrete integrated circuits 34 are located in a plane which is above the top of the base 14. Therefore, the screen will lie on the top surfaces of the integrated circuits 34 or at least be immediately adjacent thereto. Since the spheroids 52 are yieldably biased into the openings 56 of the screen 46, by the pressure pad 54, the spheroids 52 will be in thermally conductive contact with the discrete integrated circuits 34 as shown in FIG. 3. In this manner, the heat produced by operation of the high-density integrated circuit package 18 will be transferred by conduction into the spheroids 52 which are in thermally conductive contact therewith and those spheroids will, in turn, transfer the heat to all the other spheroids in the coolant chamber 20 of the apparatus 10.

Also, it is preferred that the screen 46 be formed of a thermally conductive material, such as metal, so that the screen also carries heat away from the circuit package 18. This significantly improves the heat exchange capabilities of the apparatus 10 by providing a maximum heat exchange surface area into which the coolant comes in contact as will hereinafter be described.

In addition to providing maximum heat exchange surface area, the spheroids and the screen provide another advantage. The additional advantage provided by the multiplicity of spheroids 52 and the screen 46 is that they provide a tortuous flow path for the coolant which passes through the coolant chamber 20 to prevent localized hotspots which could otherwise occur as a result of channelization, and the like. To insure that channelization, and the like, does not occur, the resilient elastomeric pressure pad 54 may be provided with plural (two shown) depending partitions 58 and 60, which integrally depend from the pad and have their depending edges proximate but spaced upwardly from the screen 46 as seen best in FIG. 3. FIG. 2 shows each of the partitions 60 as having one of their ends in abutting engagement with the sidewall segment 40d of the cover housing 36 and having their opposite ends spaced from the sidewall segment 40b to provide a flow directing path, or channel around the partition 60. Each of the other partitions 58 are seen to have one of their ends in abutting engagement with the sidewall segment 40b and having their other ends spaced from the sidewall segment 40d to provide an opposite flow path or channel around that partition. Thus, the total effect of this lateral staggering of the depending partitions 58 and 60 will be seen to direct or guide the coolant flow in a sinusoidal path through the coolant chamber.

The resilient elastomeric pressure pad 54 is preferably made of a high-temperature resilient elastomeric material, such as silicone, and may be impregnated during fabrication with a metallic particle filler so that heat may be transferred therethrough to the cover housing 36 thus allowing it to act as a heat sink.

The hereinbefore mentioned special configuration of the coolant inlet and outlet fittings 48 and 50 is seen best in FIG. 3 wherein the fitting 48 is shown in partial section. As seen, the fitting 48, and thus the fitting 50 which is identical thereto, have tubular bodies or shanks with external threads being provided on the outwardly extending ends. The inner end of each of the fittings is provided with an enlarged head having radial slots. This special head configuration is advantageous so that the flow of coolant cannot be restricted, or completely blocked, by one of the spheroids 52 moving into or being in a position wherein it would block the axial mouth of the bore of the fitting shank.

The above described apparatus 10 for cooling high-density integrated circuit packages is intended and is particularly adapted to be used in a suitable coolant circulation system (not shown) which moves a coolant through the apparatus 10. As is known in the art, coolants such as florochemical liquid coolant, freon, silicone oil, transformer oil, liquid nitrogen and the like have excellent electrical insulating properties, are chemically inert and some of these coolants have low boiling points. Therefore, such coolants which are herein generally and collectively referred to as dielectric immersion coolants may be allowed to flow into the chamber 20 of the apparatus 10 wherein the coolant will come in direct contact with the discrete integrated circuits 34 and the substrate 30 in addition to the spheres 52 and screen 46. In this way virtually everything in the chamber 20 including the housing 12, is a heat exchange surface. This, in conjunction with the excellent heat transfer properties of dielectric immersion coolants, results in a high efficient cooling apparatus.

Reference is now made to FIG. 5, wherein a second embodiment of the apparatus of the present invention is shown, with this second embodiment being indicated in its entirety by the reference numeral 62.

The apparatus 62 for cooling high-density integrated circuit packages includes a housing means 64 having a base 66 and cover 68 which cooperatively define a hermetically sealed interior chamber 70 for containment of the high-density integrated circuit package 18, and throughwhich the one of previously mentioned dielectric immersion coolants is circulatingly movable. The base housing 66 has a floor 72 with an endless upstanding sidewall 74 with an endless flange 76 extending outwardly from the upper end of the sidewall 74. The floor 72 of the base housing 66 is provided with a plurality of apertures 77 which are arranged in an array which matches that of the conductive pins 27 that depend from the substrate 30 of the circuit package 18, and those apertures are sealed in the manner hereinbefore described.

The base housing 66 is considerably deeper in comparison to the base housing 22 of the previously described apparatus 10 so that the entire integrated circuit package 18 is nestingly mounted within the confines of the sidewall 74 below the plans defined by the endless flange 76 thereof.

The cover 68 of the apparatus 62 is planar and is bolted or otherwise demountably secured to the flange 76 of the base housing 66 such as by means of the illustrated screws 78. A resilient elastomeric pressure pad 80 is interposed between the cover 68 and the endless flange 76 of the base housing 66. The pressure pad 80 is provided with a peripheral gasket bead 82 which is contained within a groove provided in the upwardly facing surface of the flange 76 and a matching groove formed in the downwardly facing surface of the cover 68. Therefore, the gasket bead 82 will hermetically seal the coolant chamber 70 provided in the base 66, of the housing means 64. The pressure pad 80 may be provided with the flow directing depending partitions 83 and 84 for the reasons discussed above.

In this embodiment, the entire coolant chamber 70 of the apparatus 62 is filled with a plurality of thermally conductive spheroids 86 so that they are biased by the pressure pad 80 into thermally conductive contact with each other and with the upwardly facing surface of the substrate 30 and with the discrete circuits 34 mounted thereon.

A coolant inlet fitting 88 and coolant outlet fitting 90 are shown as being provided on opposite sides of the cover 68 so as to extend downwardly through the cover and the pressure pad and open into the coolant chamber 70. The fittings 88 and 90 are preferably of special configuration as hereinbefore fully described with regard to the fittings 48 and 50 of the apparatus 10. Although the fittings 88 and 90 are shown as being mounted in the cover 66, it will be understood that they can just as well be mounted on opposite sides of the base housing 66.

Figure 7:
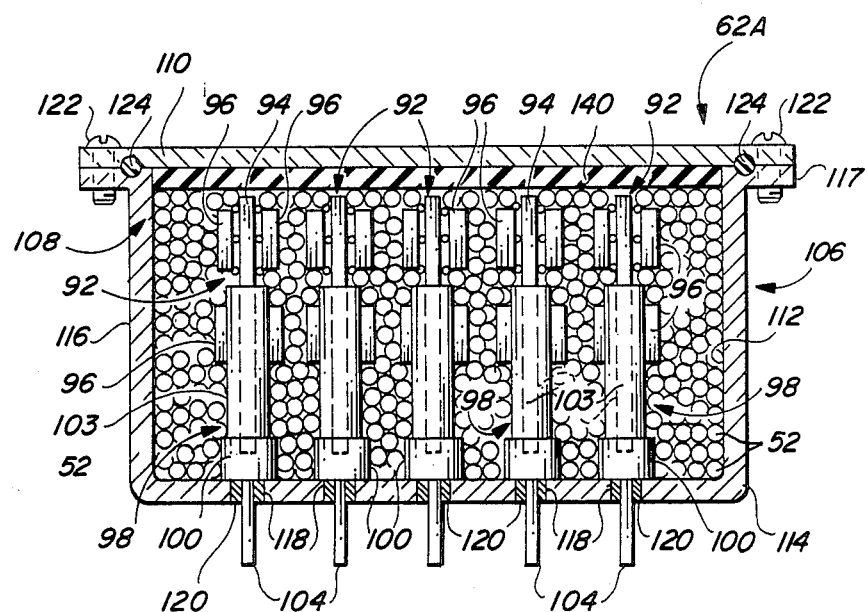
FIG. 7 is a sectional view taken along the line 7—7 of FIG. 6.

Reference is now made to FIGS. 6 and 7, wherein the second embodiment of the apparatus 62 discussed above, is shown as having been modified to contain another type of high-density integrated circuit packages with this modified apparatus being identified in its entirety by the reference numeral 62A.

The high-density integrated circuit package shown in FIGS. 6 and 7, includes a plurality of circuit board assemblies 92 each having a substrate 94 with plurality of discrete integrated circuits 96 mounted thereon in the manner well known in the art. The substrate 94, or printed circuit board, may be any suitable structure such as a multi-layer ceramic board, multi-layer metal core board, or the like, and may be of any desired size or configuration. The integrated circuits 96 may be mounted on one or both sides of the substrate 94 as is customary in the art.

Each of the circuit board assemblies 92 is mounted in its own edge board connector 98 which includes an elongated socket portion 100 with guide tracks 102 and 103 extending normally from the opposite ends thereof. Such connectors 98 are well known in the art and include a multiplicity of electrical contact means (not shown) which make electrical connection with edge pads (not shown) arranged along the length of one of the edges of the substrate 94. In this manner, electrical interconnection of the integrated circuits 96 is made via the multi-layer substrate 94 to the edge pads to the contact means (not shown) of the socket portion 100 of the edge board connector 98. The edge board connector 98 further includes a plurality of depending conductive pins 104 which are arranged linearly along the length of the socket portion 100.

The apparatus 62A for mounting and cooling the plurality of circuit board assemblies 92 includes a housing means 106 having a base housing 108 and a cover 110, which are essentially the same as the base housing 66 and cover 68 of the previously described embodiment. The main difference is that the chamber 112 thereof is sized to contain the circuit board assemblies 92. Thus, the base housing 108 has a floor 114 with an endless upstanding sidewall 116 and has an endless flange 117 extending outwardly from the upper end of the sidewall. The floor 114 is provided with a plurality of apertures 118 which are arranged in an array which matches that of the conductive pins 104 that depend from the circuit board assemblies 92, and those apertures have seals 120 for the reasons hereinbefore described.

The cover 110 of the apparatus 62A is planar and is bolted or otherwise demountably attached to the endless flange 117 of the base housing 108 such as by means of the illustrated screws 122. The housing means 106 is hermetically sealed by a suitable O-ring type gasket 124 which is mounted between the cover 110 and the flange 117.

As shown in FIG. 6, a coolant inlet fitting 126 is provided in one of the sidewall segments 127 of the endless sidewall 116 of the base housing 108. The inlet fitting 126 opens into a coolant distribution chamber 128 which is defined by the inner surface of the sidewall segment 127 and a perforated partition means 130, such as the illustrated screen. The partition means 130 is spaced inwardly and is coextensive with the sidewall segment 127, and is mounted, such as by welding, soldering or the like, to the guide tracks 102 of the edge board connectors 98. The opposite ends of the partition means 130 may be similarly attached to the opposed sidewall segments of the sidewall 116 of the base housing 108.

A coolant outlet fitting 132 is mounted in the opposite sidewall segment 134 of the base housing 108 so as to open into a coolant collection chamber 136. The collection chamber 136 is defined by the inner surface of the sidewall segment 134 and a perforated partition means 138 which may be a screen and may be mounted in the same manner as the hereinbefore described partition means 130.

A plurality of the above described thermally conductive spheroids 52 are provided in the interior chamber 112 between the perforated partition means 130 and 138 so as to completely surround and thus be in thermally conductive contact with the circuit board assemblies 92 and at least a portion of their connectors 98. A suitable resilient elastomeric pressure pad 140 of substantially planar configuration is interposed between the cover 110 and the upper layer of spheroids for biasing the spheroids into thermally conductive contact with each other and with the plural circuit board assemblies 92.

One of the dielectric immersion coolant discussed above is supplied to the coolant distribution chamber 128 and is caused to flow between and around each of the printed circuit board assemblies 92 in multiple flow paths. Each of the flow paths are tortuous due to the spheroids, and the coolant emerges from the multiple flow path and is collected in the collection chamber 136 and exits the apparatus 62A via the coolant outlet fitting 132.

While the principles of the invention have now been made clear in the illustrated embodiments, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits and scope of the invention.

What I claim is:

1. An apparatus for containing and cooling a high-density integrated circuit package comprising in combination:
   (a) a base housing defining an upwardly opening chamber;
   (b) at least one high-density integrated circuit package mounted in the bottom of the upwardly opening chamber of said base housing, said circuit package including a substrate having at least one discrete integrated circuit mounted on the upper surface of said substrate;

(c) said base housing being configured so that upwardly opening chamber thereof is deeper than the height dimension of said high-density integrated circuit package;

(d) a plurality of thermally conductive spheroids in said upwardly opening chamber of said base means so as to substantially fill that chamber and be thermally conductive contact with said high-density integrated circuit package;

(e) a cover demountably attached on the upper end of said base housing for sealingly enclosing the upwardly opening chamber of said base housing;

(f) biasing means interposed between said plurality of spheroids and said cover for biasing said spheroids into thermally conductive contact with each other and with said high-density integrated circuit package; and (g) an inlet port and an outlet port by which a dielectric immersion coolant is passable through the chamber defined by said base housing.

2. An apparatus as claimed in claim 1 wherein said biasing means is a resiliently elastomeric pressure pad which is compressingly interposed between said plurality of thermally conductive spheroids and said cover.

3. An apparatus as claimed in claim 2 wherein said resilient elastomeric pressure pad is provided with at least a spaced pair of partitions which depend therefrom into spaced proximity with said high-density integrated circuit package.

4. An apparatus as claimed in claim 1 and further comprising a dielectric immersion coolant in the internal chamber of said housing.

5. An apparatus as claimed in claim 4 wherein said dielectric immersion coolant is florochemical liquid coolant.

6. An apparatus as claimed in claim 4 wherein said dielectric immersion coolant is freon.

7. An apparatus as claimed in claim 4 wherein said dielectric immersion coolant is silicone oil.

8. An apparatus as claimed in claim 4 wherein said dielectric immersion coolant is transformer oil.

9. An apparatus as claimed in claim 4 wherein said dielectric immersion coolant is liquid nitrogen.

10. An apparatus for containing and cooling high-density integrated circuit packages comprising in combination:

(a) a base housing defining an upwardly opening chamber;

(b) at least one high-density integrated circuit package mounted in the chamber of said base housing, said package including, i. an edge board connector having an elongated socket with an upstanding guide track on each of its opposite ends.

ii. a printed circuit board demountably mounted in said edge board connector;

(c) said base housing being configured so that the upwardly opening chamber thereof is deeper than the height dimension of said circuit package and is longer than the length dimension of said circuit package to provide a coolant distribution chamber in one end of said base housing and a coolant collection chamber in the opposite end thereof;

(d) an inlet port in the one end of said base housing for admitting a dielectric immersion coolant into the coolant distribution chamber and an outlet port in the opposite end of said base housing through which the dielectric immersion coolant exits said base housing;

(e) a pair of perforated partition means each at a different end of said edge board connector for separating the coolant distribution chamber and the coolant collection chamber from said integrated circuit package;

(f) a plurality of thermally conductive spheroids in said upwardly opening chamber of said base means and located between said pair of perforated partition means so as to substantially fill the space between said pair of perforated partition means and be in thermally conductive contact with said high-density integrated circuit package; and (g) a cover demountably attached on the upper end of said base means for sealingly enclosing the upwardly opening chamber of said base housing.

11. An apparatus as claimed in claim 10 and further comprising biasing means interposed between said plurality of thermally conductive spheroids and said cover for biasing said spheroids into thermally conductive contact with each other and with said high-density integrated circuit package.

12. An apparatus as claimed in claim 11 wherein said biasing means is a resilient elastomeric pad.

13. An apparatus as claimed in claim 10 wherein each of said pair of perforated partition means is a woven screen.

14. An apparatus as claimed in claim 10 and further comprising a dielectric immersion coolant in the internal chamber of said housing.

15. An apparatus as claimed in claim 14 wherein said dielectric immersion coolant is a florochemical liquid coolant.

16. An apparatus as claimed in claim 14 wherein said dielectric immersion coolant is freon.

17. An apparatus as claimed in claim 14 wherein said dielectric immersion coolant is silicone oil.

18. An apparatus as claimed in claim 14 wherein said dielectric immersion coolant is transformer oil.

19. An apparatus as claimed in claim 14 wherein said dielectric immersion coolant is liquid nitrogen.

* * * * *